United States Patent [19]
Van Gurp

[11] Patent Number: 5,506,186
[45] Date of Patent: Apr. 9, 1996

[54] METHOD OF MANUFACTURING AN OPTOELECTRONIC DEVICE

[75] Inventor: Gerardus J. Van Gurp, Eindhoven, Netherlands

[73] Assignee: U.S. Philips Corporation, New York, N.Y.

[21] Appl. No.: 770,731

[22] Filed: Sep. 30, 1991

Related U.S. Application Data

[63] Continuation of Ser. No. 611,387, Nov. 5, 1990, which is a continuation of Ser. No. 369,564, Jun. 21, 1989, abandoned.

[30] Foreign Application Priority Data

Jun. 27, 1988 [NL] Netherlands ............... 8801631

[51] Int. Cl.⁶ ............................................. H01L 21/223
[52] U.S. Cl. ............................................................. 437/167
[58] Field of Search ........................ 437/2, 5, 141, 437/165, 166, 167

[56] References Cited

U.S. PATENT DOCUMENTS

| | | | |
|---|---|---|---|
| 3,984,267 | 10/1976 | Craford et al. | 437/167 |
| 4,280,858 | 7/1981 | Van Opdorp et al. | 437/167 |
| 4,502,898 | 3/1985 | Camlibel et al. | 437/160 |
| 4,592,793 | 6/1986 | Hovel et al. | 437/168 |
| 4,662,063 | 5/1987 | Collins et al. | 437/172 |

FOREIGN PATENT DOCUMENTS

| | | | |
|---|---|---|---|
| 0011898 | 6/1980 | European Pat. Off. | 437/167 |
| 0137169 | 8/1979 | Germany | 437/167 |
| 0072669 | 6/1979 | Japan | 437/167 |
| 0042335 | 4/1981 | Japan | 437/167 |
| 0037623 | 4/1981 | Japan | 437/167 |
| 0107689 | 6/1983 | Japan | 437/167 |
| 0053018 | 3/1985 | Japan . | |
| 0099327 | 5/1986 | Japan | 437/167 |
| 0136225 | 6/1986 | Japan . | |
| 0002530 | 1/1987 | Japan | 437/167 |

OTHER PUBLICATIONS

Colclaser, R., Microelectronics: Processing and Device Design, John Wiley & Sons, 1980, pp. 135 & 140.

Matsumoto, Y., Diffusion of Cd and Zn in InP and InGaAsP, Japanese Journal of Applied Physics, vol. 22, No. 11, Nov. 1983, pp. 1699–1704.

Yamada, M., Double zinc diffusion fronts in InP–Theory and Experiment, Appl. Phys. Lett. 43(6), 15 Sep. 1983, pp. 594–596.

Ando, H., Low–temp. Zn and Cd diffusion Profiles in InP and Formation of Guard Ring in InP. IEEE Trans. on Elect. Devices, vol. ED–29, Avalanche Photodiodes, No. 9, Sep. 1982, pp. 1408–1413.

*Primary Examiner*—R. Bruce Breneman
*Attorney, Agent, or Firm*—Michael J. Balconi-Lamica; Paul R. Miller

[57] ABSTRACT

The invention relates to a method of manufacturing an optoelectronic device. An indium phosphide part of a semiconductor body is contacted either directly or indirectly through a ternary or quaternary layer by means of a zinc diffusion. In order to improve the contact resistance, after the zinc diffusion and before the application of contacts, a heat treatment of the semiconductor body is carried out in the absence of a zinc source.

7 Claims, 1 Drawing Sheet

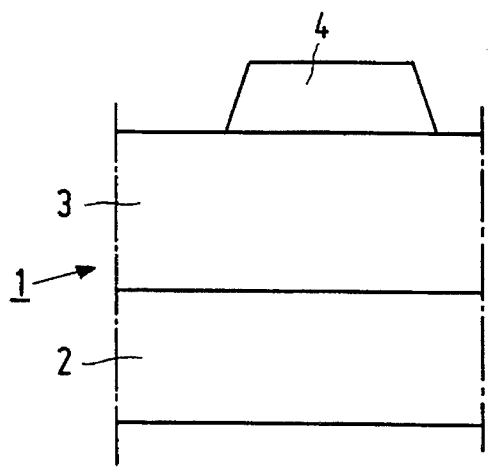
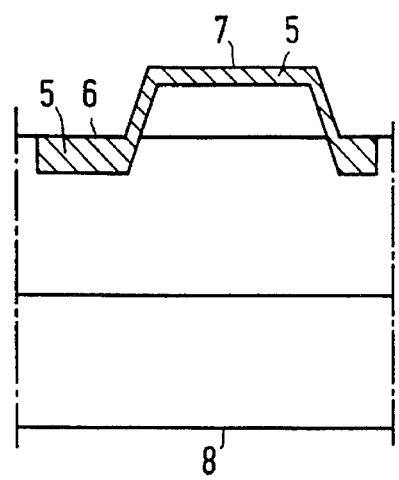
FIG.1a    FIG.1b
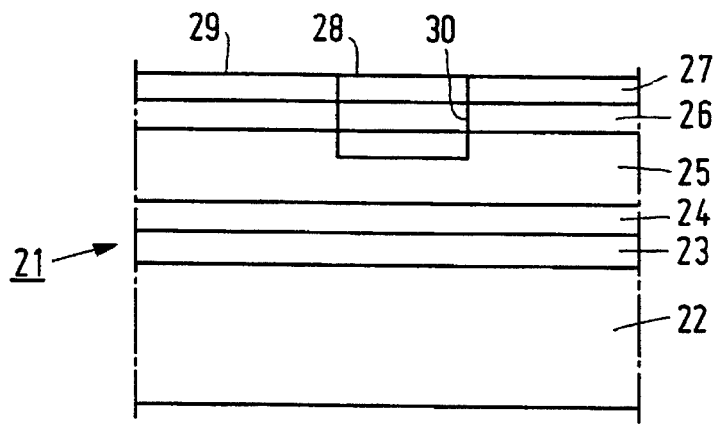
FIG.2
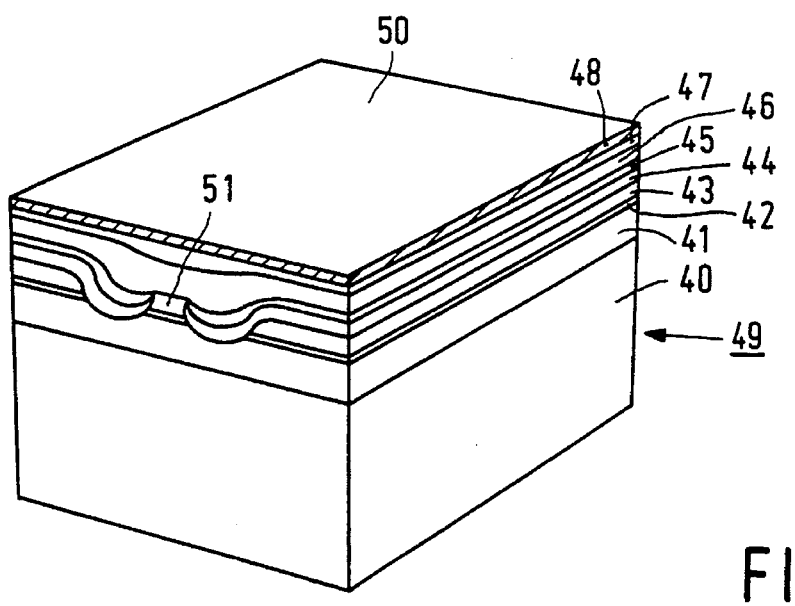
FIG.3

METHOD OF MANUFACTURING AN OPTOELECTRONIC DEVICE

This application is a continuation application of previous application Ser. No. 07/611,387, filed Nov. 5, 1990, which is a continuation application of previous application Ser. No. 07/369,564, filed Jun. 21, 1989, now abandoned and all benefits for such earlier applications are hereby claimed for this new continuation application.

The invention relates to a method of manufacturing an optoelectronic device comprising a monocrystalline semiconductor body, which consists at least in part of substantially pure indium phosphide, while for forming a p-type diffusion region in the presence of a zinc source zinc is diffused into the semiconductor body.

The term "substantially pure" is to be understood to mean herein "apart from dopants present".

A method of the kind mentioned in the opening paragraph is known, for example, from I.E.E.E. Trans. on Electr. Dev., Vol. ED-29, No. 9, September 1982, pp. 1408–1413.

The zinc source consists, for example, of zinc phosphide ($Zn_3P_2$), the phosphorus serving to counteract the evaporation of phosphorus from the semiconductor body during the diffusion treatment.

In known diffusion treatments, the problem arises that the net concentration of the acceptor zinc in indium phosphide is mostly too low for providing low-ohmic contacts on the semiconductor body.

The invention has inter alia for its object to provide a method in which this problem is avoided at least to a considerable extent.

The invention is based inter alia on the recognition of the fact that this higher acceptor concentration in indium phosphide can be obtained during a treatment supplementary to the diffusion treatment.

According to the invention, the method mentioned in the opening paragraph is therefore characterized in that after the diffusion treatment the semiconductor body is subjected in the absence of a zinc source to a heat treatment, while the surface of the semiconductor body at the area of the p-type region is pervious to zinc during said heat treatment.

"Perviousness of the surface of the semiconductor body" is to be understood to mean herein that the surface during the heat treatment is the same through which in a preceding step zinc is diffused into the semiconductor body, but, for example, also that a layer pervious to zinc at the operating temperature, for example a silicon oxide layer, can be present on the surface.

With the method according to the invention, the surprising effect is obtained due to the absence of the zinc source and due to the presence of zinc in only a surface layer of the semiconductor body formed by diffusion that the acceptor concentration in the surface layer of the indium phosphide body of, for example, about $10^{18}$ cm$^{-3}$ increases during the heat treatment to about $10^{19}$ cm$^{-3}$.

The heat treatment can be so short that there is no risk of decomposition of indium phosphide.

Preferably, the heat treatment of the semiconductor body is carried out at a temperature between 400° and 600° C.

Preferably, during the diffusion treatment, a pn junction is formed by diffusion of zinc into an n-type indium phosphide body. With the method according to the invention, a higher acceptor concentration is attainable.

Preferably, during the diffusion treatment, zinc is diffused into the indium phosphide part in a sufficiently high concentration to obtain a p-type region having a sufficiently high concentration of charge carriers to form thereon an ohmic contact having a sufficiently low contact resistance. If desired, the expensive use, for example, of a quaternary layer of indium gallium arsenide phosphide (InGaAsP) on the indium phosphide (InP) may thus be avoided.

Such a quaternary layer is frequently used for contacting indium phosphide because the solubility of acceptors is high therein and the contact resistance between the quaternary layer and indium phosphide is low.

Nevertheless, in order to obtain given optoelectronic structures, it may be desirable to use the quaternary layer or a ternary indium gallium arsenide layer. However, it has been found that with diffusion of zinc into the quaternary layer the electrical resistance of the p-type indium phosphide increases due to the fact that the acceptor concentration in the indium phosphide decreases.

Preferably, if during the diffusion treatment zinc is diffused into a quaternary indium gallium arsenide phosphide layer or into a ternary indium gallium arsenide layer disposed on a p-type indium phosphide layer, the diffusion treatment is therefore followed by a heat treatment in the absence of a zinc source.

Due to the heat treatment, the electrical resistance of the indium phosphide decreases due to the fact that the acceptor concentration in the indium phosphide increases again.

The invention will now be described with reference to a number of examples and the accompanying drawing.

BRIEF DESCRIPTION OF THE DRAWINGS

In the drawing:

FIGS. 1a–b show diagrammatically and in sectional view a part of a first optoelectronic device at successive stages of manufacture by means of the method according to the invention, FIG. 2 shows diagrammatically and in sectional view a part of a second optoelectronic device at a stage of manufacture by means of the method according to the invention, and FIG. 3 shows diagrammatically an elevation of a part of a third optoelectronic device at a stage of manufacture by means of a method according to the invention.

EXAMPLE 1

The optoelectronic device manufactured by means of the method according to the invention is in this example a semiplanar photodiode.

The semiplanar photodiode comprises a monocrystalline semiconductor body 1 (cf. FIG. 1a), which consists of a part 2 of a 200 μm thick n$^+$ type indium phosphide substrate and of a part 3 of a 6 μm thick epitaxial n-type indium phosphide layer formed on the substrate 2 and having a donor concentration of ~3×10$^{14}$ cm$^{-3}$. The layer 3 is provided with a 3 μm thick epitaxial n-type layer 4 of In$_{0.53}$Ga$_{0.47}$As having a donor concentration of ~3×10$^{15}$ cm$^{-3}$ (diameter 80 μm). For forming a p$^+$ type diffusion region 5 (cf. FIG. 1b), in a conventional manner, while using a silicon nitride mask (not shown), in the presence of a zinc source consisting of a mixture of ZnAs$_2$, ZnP$_2$ and InP powders, zinc is diffused into the semiconductor body 1 at 550° C.

The net acceptor concentration at the surface 6 of the part 3 after the zinc diffusion is 2–4×10$^{18}$ cm$^{-3}$ (depth of the region 5 in situ 1.2 μm) and that at the surface 7 of the layer 4 is 5–7×10$^{19}$ cm$^{-3}$ (depth of the region 4 in situ 0.4 μm). The acceptor concentration at the surface 6 can be increased considerably in accordance with the invention if after the diffusion treatment the semiconductor body 1 is subjected in the absence of a zinc source to a heat treatment, while the surface 6 at the area of the p-type region 5 is pervious to zinc during this heat treatment. Due to a heat treatment for 15 minutes at 400°–600° C., for example 500° C., in a mixture of nitrogen and hydrogen, the net acceptor concentration at the surface 6 increases to $8-10^{18}$ cm$^{-3}$, while that at the surface 7 remains practically unchanged.

The specific contact resistance with platinum at the surface 6 decreases from $1-2\times10^{-4}$ $\Omega$ cm$^2$ to $5-7\times10^{-5}$ $\Omega$ cm$^2$. In a conventional manner, surfaces 6 and 8 are provided with platinum and gold-germanium-nickel contacts, respectively, and finished to form a photodiode, in which during operation light is absorbed in the InGaAs layer 4. It is apparent from this example that the method according to the invention can be used to obtain a p-type region having a sufficiently high concentration of charge carriers to form thereon an ohmic contact having a sufficiently low contact resistance. Further, in this example, a pn junction is formed in an n-type indium phosphide body.

It will appear from the following example that the method according to the invention can also serve solely for contacting p-type indium phosphide.

EXAMPLE 2

The optoelectronic device manufactured by means of the method according to the invention is in this example a light-emitting diode, in which the current passage is locally limited to the surface of the semiconductor body.

The light-emitting diode comprises a monocrystalline semiconductor body 21 (cf. FIG. 2), which consists for a part 22 of a 100 μm thick n$^+$ type indium phosphide substrate having a donor concentration of $2\times10^{18}$ cm$^{-3}$ and for a part 23 of a 1 μm thick epitaxial n-type indium phosphide layer provided on the substrate 22 and having a donor concentration of $\sim5\times10^{17}$ cm$^{-3}$.

The layer 23 is provided with an active 1 μm thick epitaxial n-type indium gallium arsenide phosphide layer 24 having an acceptor concentration of $10^{17}-10^{19}$ cm$^{-3}$. The layer 24 has a composition, due to which this layer can emit light at, for example, 1.3 μm.

A 1.8 μm thick epitaxial p-type indium phosphide layer 25 having an acceptor concentration of $8-10\times10^{17}$ cm$^{-3}$ is provided on the layer 24. The layer 25 is provided successively with a 0.6 μm thick epitaxial n-type blocking layer 26 of indium gallium arsenide phosphide having a donor concentration of $8\times10^{17}$ cm$^{-3}$ and a 0.3 μm thick epitaxial p-type indium gallium arsenide layer 27 having an acceptor concentration of $3\times10^{18}$ cm$^{-3}$.

In a conventional manner, for example in the manner indicated in Example 1, in the presence of a zinc source again zinc is diffused into the semiconductor body 21 for forming a p-type diffusion region 30 over a part 28 having a diameter of 25 μm of the surface 29 of the semiconductor body 21.

The diffusion region 30 (surface concentration $5\times10^{18}$ cm$^{-3}$) extends into the p-type indium phosphide layer 25 and has from the surface 29 a depth of about 1.5 μm. Before the zinc diffusion, the net acceptor concentration in the p-type indium phosphide layer 25 is $8-10\times10^{17}$ cm$^{-3}$. After the zinc diffusion the latter is $3-6\times10^{17}$ cm$^{-3}$. The latter value can be increased again to $8-10\times10^{17}$ cm$^{-3}$ if according to the invention after the diffusion treatment the semiconductor body 21 is subjected in the absence of a zinc source to a heat treatment, while the surface 29 is subjected at the area of the p-type region 30 to a heat treatment, while the surface 29 is pervious to zinc during this heat treatment at the area of the p-type region 30. The heat treatment lasted 15 minutes and was carried out at 475° C.

Over the whole surface 29, a platinum contact layer can be provided. Light emission can remain limited to the part of the layer 25 defined by the region 30, which radiation can be emitted, for example, through an opening in a contact layer to be provided on the substrate 22.

In this example and in the preceding example, the diffused regions extend in or into the indium phosphide. It appears from the following example that the invention is not limited thereto.

EXAMPLE 3

The optoelectronic device manufactured by means of the method according to the invention is in this example a planar buried heterostructure laser having two channels (cf. FIG. 3).

As indicated in FIG. 3, this layer is composed of a 100 μm thick n-type indium phosphide substrate 40, a 4 μm thick n-type indium phosphide layer 41, a 0.15 μm thick indium gallium arsenide phosphide layer 42, p-type indium phosphide layers 43 and 44 having thicknesses of 1 and 0.5 μm, respectively, a 0.5 μm thick n-type indium phosphide layer 45, a 1 μm thick p-type indium phosphide layer 46 and a 1 μm thick p-type indium gallium arsenide phosphide layer 47. (The indicated layer thicknesses are given at a distance from the active region 50.)

For contacting the layer 47, a p-type diffusion region 48 is formed on the semiconductor body 49 on the side of the layer 47 by diffusing in the presence of a zinc source zinc into the semiconductor body 49.

Before the zinc diffusion, the net acceptor concentration in the p-type InGaAsP layer 47 is $3\times10^{18}$ cm$^{-3}$ and in the p-type InP layer 46 is $2\times10^{18}$ cm$^{-3}$. After the zinc diffusion, the net acceptor concentration in the p-type InGaAsP layer 47 (at the surface 50) is $2\times10^{19}$ cm$^{-3}$ and in the p-type InP layer 46 is $6\times10^{17}$ cm$^{-3}$. In the layer 47, the acceptor concentration therefore increased, while it decreased in the layer 46.

If now after the diffusion treatment according to the invention the semiconductor body 49 is subjected in the absence of a zinc source to a heat treatment, the surface 50 of the semiconductor body being pervious to zinc during this heat treatment at the area of the p-type region 48, the acceptor concentration in the p-type InGaAsP layer 47 (at the surface 50) becomes $2.5\times10^{19}$ cm$^{-3}$ and the acceptor concentration in the p-type InP layer 46 is restored to $2\times10^{18}$ cm$^{-3}$.

The heat treatment lasted half an hour and was carried out at 475° C.

It will be appreciated that the invention is not limited to the given examples, but that many variations are possible for those skilled in the art without departing from the scope of the invention.

For example, the semiconductor body may entirely consist of indium phosphide.

I claim:

1. A method of manufacturing acceptor enhanced InP layers in optoelectronic device comprising the steps of (a) diffusing zinc from a zinc source into a surface of a monocrystalline semiconductor body including at least in part substantially pure InP to form a p-type surface diffusion region at said surface, said p-type surface diffusion region being formed with a first net acceptor level concentration, (b) removing said zinc source, and (c) heating said p-type surface diffusion region for a period of time and at a temperature to increase said first net acceptor level concentration to a second higher net acceptor level concentration at said surface, said surface being pervious to zinc during said heating.

2. A method according to claim 1, wherein said step (a) is carried out in a n-type InP layer in said semiconductor body.

3. A method according to claim 1, wherein a low ohmic contact is provided on said semiconductor body in relation to said second higher acceptor level concentration.

4. A method according to claim 1, wherein said step (c) is carried out by heating said p-type region of InP at a temperature of 400° to 600° C. for a time of 15 to 30 minutes.

5. A method according to claim 1, wherein said semiconductor body is formed with additional layers of at least one of quaternary indium gallium arsenide phosphide and ternary indium gallium arsenide.

6. A method according to claim 1, wherein at least one pn junction is formed with said p-type region of InP at said second higher acceptor level concentration.

7. A method according to claim 1, wherein said zinc source is formed from a mixture of $ZnAs_2$, $ZnP_2$, and InP powders.

* * * * *